(12) United States Patent
Tai et al.

(10) Patent No.: US 7,597,530 B2
(45) Date of Patent: Oct. 6, 2009

(54) METHOD FOR CONVEYING AND APPARATUS USING THE SAME

(75) Inventors: Po-nan Tai, Yangmei Township, Taoyuan County (TW); Ching-yun Chen, Hsinchu (TW); Hung-wei Cheng, Sinjhuang (TW)

(73) Assignee: Hannstar Display Corporation, Tao Yuan County (TW)

( * ) Notice: Subject to any disclaimer, the term of this patent is extended or adjusted under 35 U.S.C. 154(b) by 340 days.

(21) Appl. No.: 11/001,183

(22) Filed: Dec. 2, 2004

(65) Prior Publication Data

US 2005/0281658 A1     Dec. 22, 2005

(30) Foreign Application Priority Data

May 6, 2004     (TW) ............................... 93112816 A

(51) Int. Cl.
    *H01L 21/677*     (2006.01)
(52) U.S. Cl. ....................................... 414/806; 414/810
(58) Field of Classification Search ................. 414/806, 414/810, 222.01, 331.01, 672; 74/490.12, 74/490.13, 490.14, 490.15, 63
See application file for complete search history.

(56) References Cited

U.S. PATENT DOCUMENTS

| | | | |
|---|---|---|---|
| 5,989,346 A * | 11/1999 | Hiroki ........................ | 118/719 |
| 6,152,677 A * | 11/2000 | Tateyama et al. ............ | 414/738 |
| 6,190,113 B1 * | 2/2001 | Bui et al. ..................... | 414/672 |
| 6,193,507 B1 * | 2/2001 | White et al. ................. | 432/247 |
| 6,309,163 B1 * | 10/2001 | Nering .................. | 414/331.01 |
| 6,331,095 B1 * | 12/2001 | Hiroki .................... | 414/222.01 |
| 6,592,317 B1 * | 7/2003 | Rush et al. ................... | 414/217 |
| 6,949,143 B1 * | 9/2005 | Kurita et al. ................ | 118/719 |
| 7,246,984 B2 * | 7/2007 | Sarumaru et al. ........... | 414/217 |

* cited by examiner

*Primary Examiner*—Charles A Fox
(74) *Attorney, Agent, or Firm*—Harness, Dickey & Pierce, P.L.C.

(57) ABSTRACT

A method for conveying an object and a conveying apparatus are provided. The method includes steps of loading a first object at a first position by a transmission apparatus, loading a second object onto a carrying platform, providing a supporter having a first holder and a second holder, unloading the second object by the transmission apparatus, and adjusting a position of the supporter relative to that of the carrying platform for locating the first object on the carrying platform. The provided method and conveying apparatus adopts a single supporter for conveying the objects. The object standby for being processed and the processed one can be loaded and unloaded with greater safety and stability thereby.

16 Claims, 7 Drawing Sheets

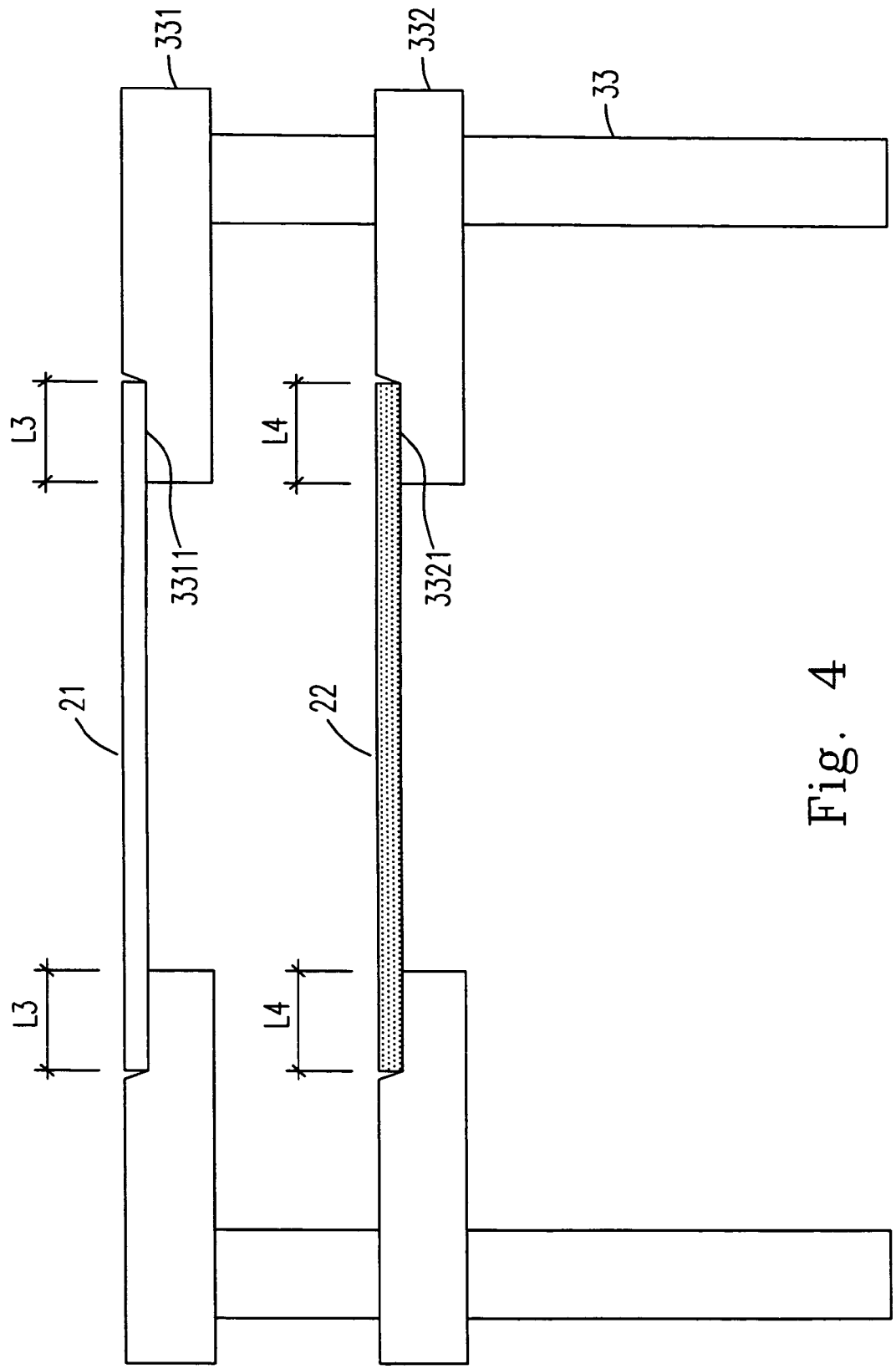

METHOD FOR CONVEYING AND APPARATUS USING THE SAME

FIELD OF THE INVENTION

The present invention is related to a method and an apparatus for conveying an object, and in particular to the method and the apparatus which conveys the object with great safety and stability.

BACKGROUND OF THE INVENTION

In the present electronic product industry, there are several processes involved in manufacturing an electronic device, and different processing systems and methods are necessary to be adopted while fabricating different components thereof. Besides, a sealed environment and even a clean environment are also of great importance for the mentioned processes and apparatuses, such as the electroplating, the etching, the depositing, the sputtering, the packaging and the testing processes and the relevant apparatuses.

However, the conventional processing system, which includes a conveying belt or a transmission apparatus for loading an electronic component for being processed therein and unloading the processed electronic component therefrom, is not able to satisfy the mentioned demands. A quite long distance for conveying and transmitting the electronic components is always necessary for the electronic component fabrication because several conventional processing systems are included therein. Hence the whole apparatus would occupy a lot of space. Furthermore, the electronic component, no matter the one for being processed or the processed one, would be at a great risk of being contaminated and damaged. Moreover, the entry and the export of the processing system need to be respectively opened when the electronic component is loaded therein and unloaded therefrom, which may also result in a contamination of the processing system. Therefore, such a processing system is not practical as its high cost in addition to the mentioned drawbacks.

In the present days, a processing system having only an entry for the electronic component is commonly applied in the electronic component fabrication. All the electronic components including the processed ones and the ones for being processed are respectively loaded into the processing system and unloaded therefrom. Hence the conveying or the transmitting distance can be reduced and the electronic components are further protected from being contaminated in the process. Through the transmission apparatus, an electronic component for being processed is loaded into the processing system, and then the electronic component, which is processed therein, is unloaded therefrom. For loading and unloading the electronic component more easily, a conveying apparatus needs to be configured in the processing system.

Please refer to FIG. 1, which is a diagram showing a conventional conveying apparatus configured in the processing system according to the prior art. The conventional conveying apparatus includes a first supporter 11 and a second supporter 12 with different heights for respectively holding a first object 21 loaded in and a second object 22 unloaded by a transmission apparatus 10, which is shown in FIG. 2. A holder 111 is configured with the first supporter 11 for holding the first object 21 and then being lowered, so that the first object 21 can be transferred to the carrying platform of the processing system (not shown). The second object 22 is lifted off the carrying platform through the second supporter 12, so as to be conveyed by the transmission apparatus 10. With reference to FIGS. 2(A) and 2(B), which are top-views showing the arrangements of the first supporter 11 and the second supporter 12, respectively, it is apparent that the first object 21 is held by the first supporter 11 and the second object 22 is held by the second supporter 12.

Since the first supporter 11 is arranged at the outer portion of the processing system and the second supporter 12 is arranged at the inner portion thereof, the respective holding areas for holding objects are different. As shown in FIG. 1, L1 and L2 are the holding lengths of the holding areas for the first object 21 and the second object 22, respectively, wherein L2 is smaller than L1. Accordingly, the holding area of the second supporter 12 for holding the second object 22 is smaller than that of the first supporter 11 for holding the first object 21, which will make the second object 22 easy to fall out of its position in the processing if a vibration of the processing system or an operation error for the transmission apparatus 10 happens.

Moreover, fall of the second object 22 not only hurts itself but also damages the carrying platform or the other apparatus configured in the processing system. This may cause the processing system to shut down. The whole process has to be broken down because the hurt object needs to be taken off therefrom, the processing system needs to be cleaned out, and the broken parts thereof also need to be repaired. The mentioned cleaning and repairing always take much time and money. Besides, the hurt object may contaminate the processing system and the production yield is reduced accordingly. An additional production cost is hence necessary.

Based on the mentioned points, it is necessary for the manufacturers to develop a processing system with an improved conveying or transmission apparatus for overcoming the drawbacks of the conventional ones. An improved method and an improved apparatus for conveying are provided in the present application accordingly.

SUMMARY OF THE INVENTION

In accordance with a first aspect of the present invention, a method and an apparatus for conveying are provided. The conveyed object sliding and damaging can be overcome through the provided method and apparatus, which is much simplified. The production cost and the time consuming are reduced accordingly.

According to a second aspect of the present invention, a method and an apparatus for conveying an object are provided. The conveying apparatus has a supporter configured therein, which is able to be elevated. Furthermore, two holders with different heights are configured thereon. The object is conveyed with safety and stability by controlling the supporter and the holders. Since the holders are configured at the same supporter and have identical holding areas for holding the object, the object is easy to be positioned and conveyed. The production efficiency is increased due to the reduction of the possibility of the object sliding and falling.

According to a third aspect of the present invention, a method for conveying an object is provided. The method includes steps of loading a first object at a first position by a transmission apparatus, loading a second object onto a carrying platform, providing a supporter having a first holder and a second holder, unloading the second object by the transmission apparatus, and adjusting a second distance between the supporter and the carrying platform for locating the first object on the carrying platform.

Preferably, when a first distance between the supporter and the transmission apparatus is adjusted, the first object is held at the first position by the first holder and the second object is held at a second position by the second holder.

Preferably, a distance between the first holder and the second holder is constant.

Preferably, a holding area of the first holder for holding the first object is equal to that of the second holder for holding the second object.

Preferably, the second holder is located at a position corresponding to that of the carrying platform when the first object is located at the first position.

Preferably, the method further includes a step of adjusting the first distance to locate the transmission apparatus between the first position and the second position after the first object is held at the first position and the second object is held at the second position.

Preferably, the method further includes a step of adjusting the second distance so that the first holder is located at a third position and the second holder is located at a fourth position.

Preferably, the third position is equal to the first position.

Preferably, the fourth position is equal to the third position.

Preferably, the method further includes a step of adjusting the first distance after the first holder is located at the third position and the second holder is located at the fourth position, wherein the transmission apparatus is located between the fourth position and a position of the carrying platform.

Preferably, the method further includes a step of adjusting the second distance after the first distance being adjusted, so that the first holder is located at the first position and the second holder is located at the second position.

Preferably, the method further includes a step of rotating the supporter after the first object is loaded onto the carrying platform.

Preferably, the method further includes a step of adjusting the second distance between after the supporter being rotated, so that the second holder is moved to be located at a position of the carrying platform.

Preferably, the method further includes a step of rotating the supporter after the second holder being moved to be located at the position of the carrying platform.

According to a fourth aspect of the present invention, a conveying apparatus having a conveying structure for conveying a first object and a second object is provided, wherein the first object is standby for being processed and the second object is processed. The conveying structure includes an elevating platform and a supporter configured on the elevating platform and having a first holder and a second holder for carrying the first object and the second object, respectively.

Preferably, the conveying apparatus further includes a carrying platform having a hole thereon corresponding to the supporter, wherein the first object is processed on the carrying platform to form the second object.

Preferably, the conveying apparatus further includes a transmission apparatus for loading the first object and unloading the second object.

Preferably, the conveying apparatus further includes a turning device configured on the elevating platform and connected to the supporter for rotating the supporter.

Preferably, the first holder and the second holder respectively have a first holding part and a second holding part for holding the first object and the second object.

Preferably, the first holding part and the second holding part are fillister structures.

Preferably, a holding area of the first holding part is equal to that of the second holding part.

Preferably, the first holder and the second holder are configured on the supporter by inlaying.

Preferably, the first object and the second object are ones selected from a group consisting of a glass substrate, a circuit board, a wafer and a planar electronic component.

Preferably, the conveying apparatus is further configured in a process system being one selected form a group consisting of a sputtering system, an electroplating system, an etching system, a depositing system, a packaging system, a testing system and a treating system in a sealed environment.

The foregoing and other features and advantages of the present invention will be more clearly understood through the following descriptions with reference to the drawings, wherein:

BRIEF DESCRIPTION OF THE DRAWINGS

FIG. 4 is a diagram showing the configuration of the conveying apparatus according to the preferred embodiment of the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
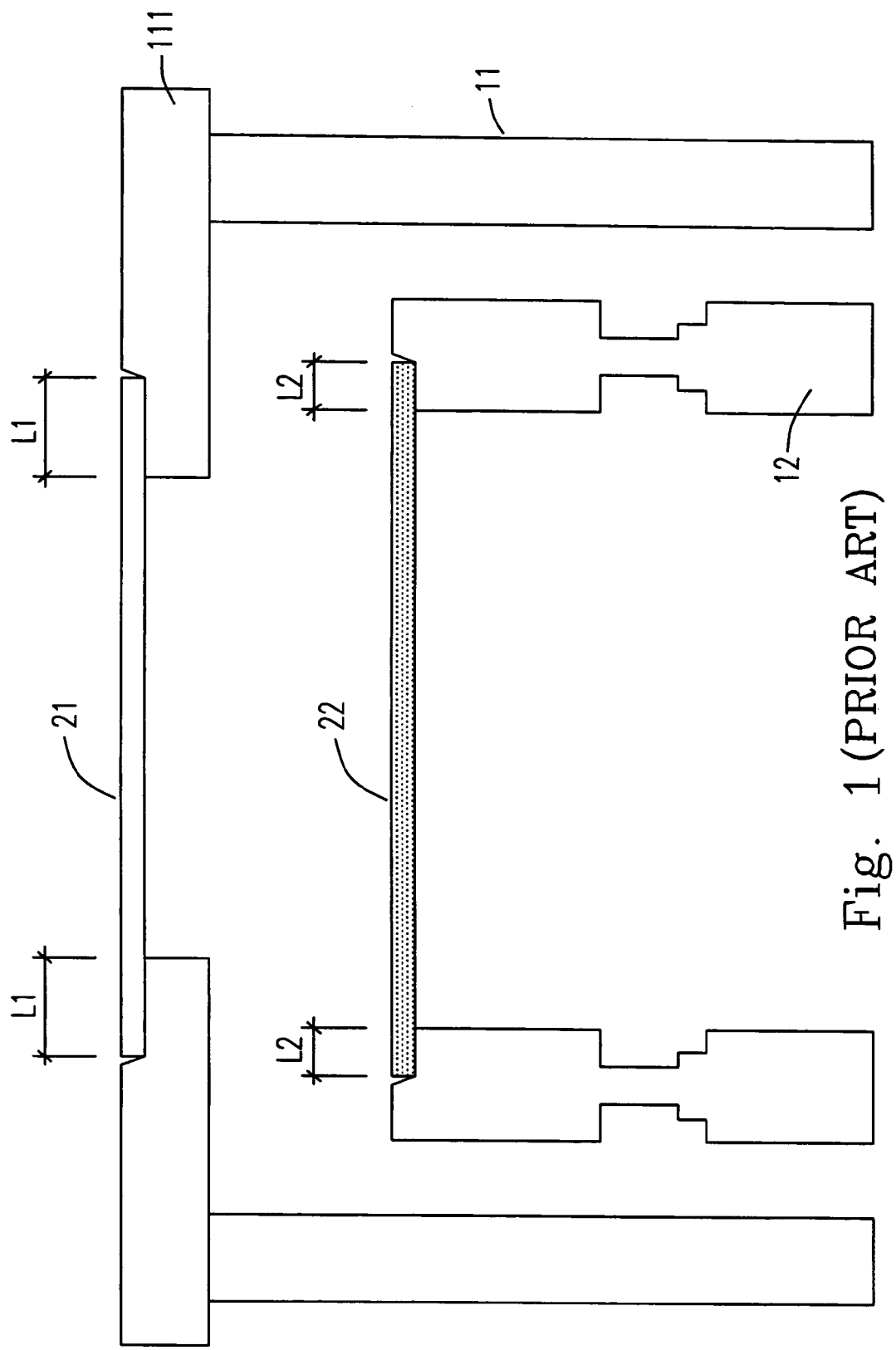
FIG. 1 is a diagram showing a conventional conveying apparatus configured in the processing system according to the prior art.
Figure 2A:
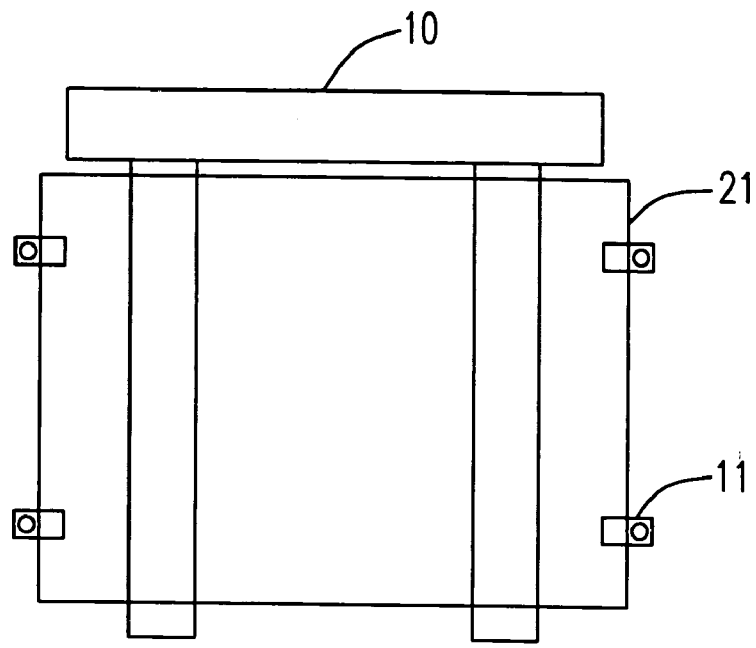
FIGS. 2(A) and 2(B) are top-views respectively showing the arrangements of the first supporter and the second supporter configured in the processing system of FIG. 1.
Figure 2B:
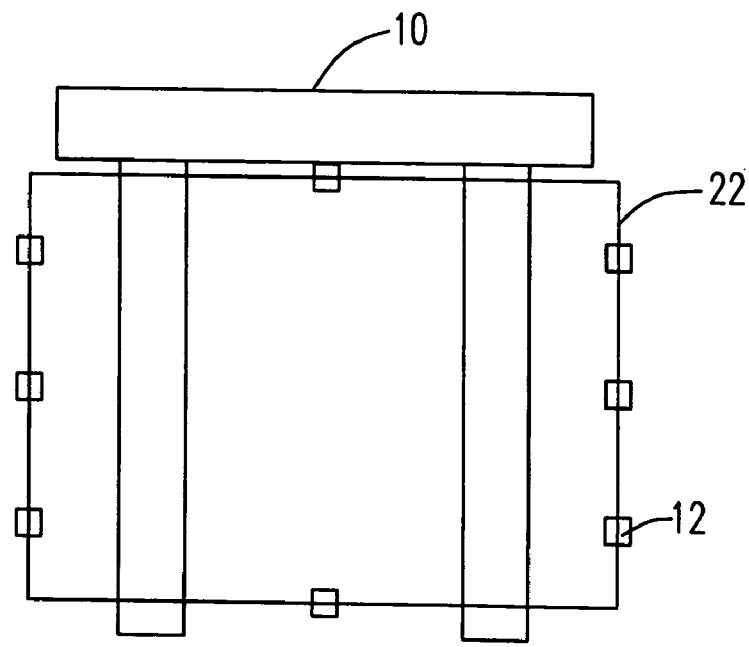
Figure 3:
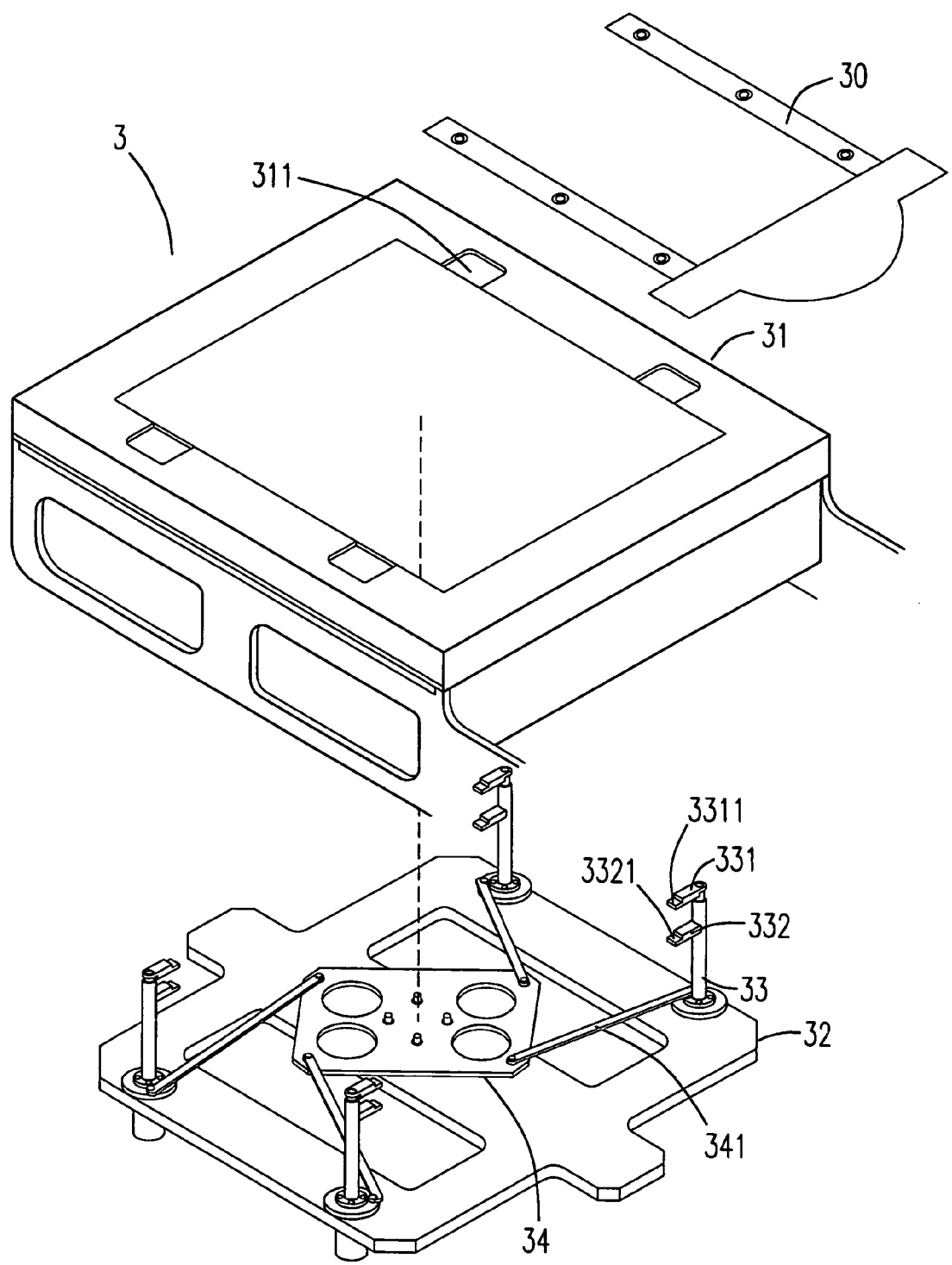
FIG. 3 is a diagram showing the configuration of the conveying apparatus according to a preferred embodiment of the present invention.

Please refer to FIGS. 3 and 4 showing the configuration of the conveying apparatus according to example embodiments. The conveying apparatus 3 includes a carrying platform 31 and an elevating platform 32, wherein a first object 21 or a second object 22 (as shown in FIG. 4) is disposed on the carrying platform 31 to be processed. The elevating platform 32 is configured exactly below the carrying platform 31 and has a plurality of supporters 33 disposed thereon. A first holder 331 and a second holder 332 are respectively configured at a first position and a second position on each of the supporters 33, and the distance therebetween is constant. The carrying platform 31 has a plurality of holes 311 thereon respectively corresponding to the supporter 33, so that the supporter 33 would lift smoothly via the hole 311 on the carrying platform 31, while the elevating platform 32 is elevated. In addition, the elevating platform 32 further has a turning device 34 with a plurality of rods 341. The first holder 331 and the second holder 332 configured on each of the supporters 33 are rotated by the corresponding rod 341. The plurality of supporters 33 are linked to one another through the rods 341 and the turning device 34, so that the first holders 331 and the second holders 332 mounted on the supporters 33 can be rotated simultaneously. According to an example embodiment, the elevating movement of the elevating platform 32 and the rotation of the first holder 331 and the second holder 332 for respectively holding the first object 21 and the second object 22, which are conveyed by the transmission apparatus 30, are controlled. Hence the objects are loaded and unloaded with safety thereby. Although it is preferable to carry out the example embodiments by using four supporters as illustrated in FIG. 3, one skilled person in the art could also use any number of plural supporters to accomplish the present invention. For simplifying the illustrations, the plural components, such as the supporters 33, the first holders 331 and the second holders 332, are mentioned by singular noun in following descriptions.

As shown in FIG. 4, the first holder 331 on the supporter 33 is configured to hold the first object 21, and the second holder 332, which is located at a second position with a lower height on the supporter 33, is configured to hold the second object 22. Compared with the prior art, the first object 21 and the second object 22 are held on the same supporter in the conveying apparatus of the present invention. Furthermore, the first holder 331 and the second holder 332 respectively have a first holding part 3311 and a second holding part 3321 configured thereon. Both the first holding part 3311 and the second holding part 3322 have fillister structures and respectively contact the first object 21 and the second 22 to supporter and position them. Besides, the first holding part 3311 and the second holding part 3322 have the same length, i.e. L3 is equaled to L4, and the holding areas thereof are identical, so as to prevent the first object 21 or the second object 22 from falling while the transmission apparatus 30 is erroneously operated. Preferably, in order to improve the transmission stability of the first object 21 and the second object 22, an additional treatment for being skidproof is provided to the contact surface of the first holding part 3311 and the second holding part 3322.

Figure 5A:
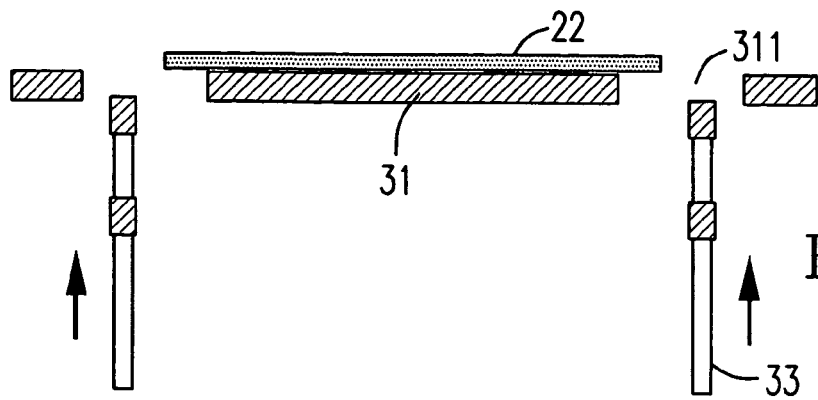
FIGS. 5(A) to 5(H) are diagrams schematically illustrating the method according to a preferred embodiment of the present invention.

Please refer to FIGS. 5(A) to 5(H), which illustrate the method according to a preferred embodiment of the present invention. FIG. 5(A) shows that the second object 22 is disposed on the carrying platform 31 of the conveying apparatus 3 for being processed. The supporter 33, the first holder 331 and the second holder 332 are located below the carrying platform 31 in the meanwhile. While the second object 22 is processed, the supporter 33 would lift due to the elevation movement of the elevating platform 32, as shown in FIG. 3. The second distance between the supporter 33 and the carrying platform 31 is adjusted, which prevents the lifting supporter 33 from colliding the second object 22 on the carrying platform 31 when the first holder 331 passes through the hole 311.

Figure 5B:
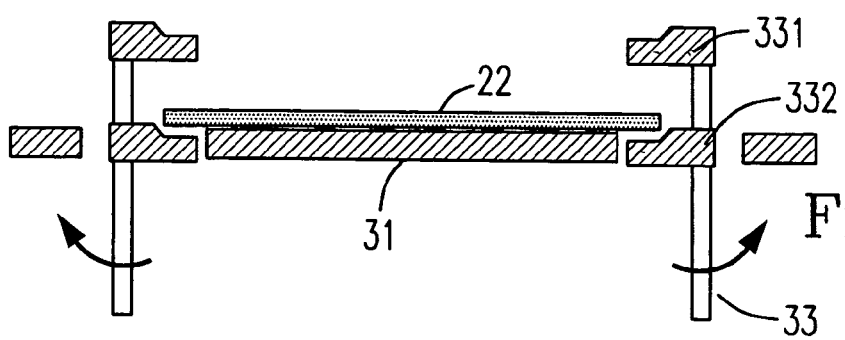

As shown in FIG. 5(B) and FIG. 3, when the supporter 33 lifts to a position closed to that of the carrying platform 31, that is to say, when the first holder 331 is located at the position above the carrying platform 31 and the second holder 332 is located on the position as high as the carrying platform 31, the supporter 33 is rotated by the rotating device 34, and the first holder 331 and the second holder 332 are hence turned to be perpendicular to each other for holding the second object 22.

Figure 5C:
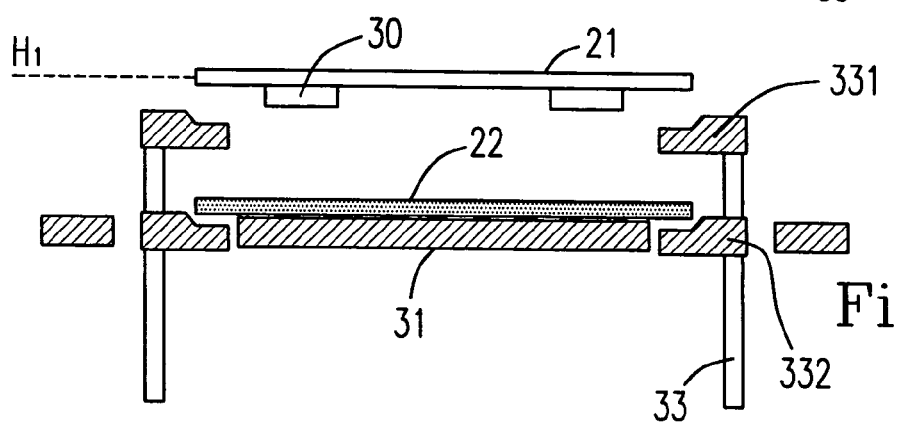

As shown in FIG. 5(C), the first distance between the supporter 33 and the transmission apparatus 30, which has the first object 21 therein, is adjusted so that the transmission apparatus 30 is at a first position H1 for loading the first object 21. In the meanwhile, the first holder 331 and the second holder 332 are still respectively located at the same positions shown in FIG. 5(B), and the second object 22 is also located on the carrying platform 31. The second holder 332 is now standby to hold the second object 22.

Figure 5D:
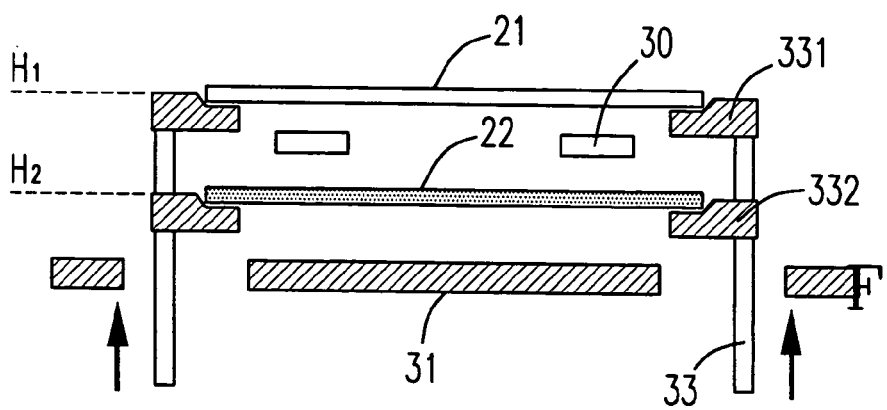

As shown in FIG. 5(D), the second distance between the supporter 33 and the carrying platform 31, which has the first object 21 therein, is adjusted and the supporter 33 lifts to the first position H1 accordingly, so as to lift up the first object 21 via the first holder 331. Moreover, the second object 22, which was disposed on the carrying platform 31, is held and conveyed to a second position H2 by the second holder 332.

Figure 5E:
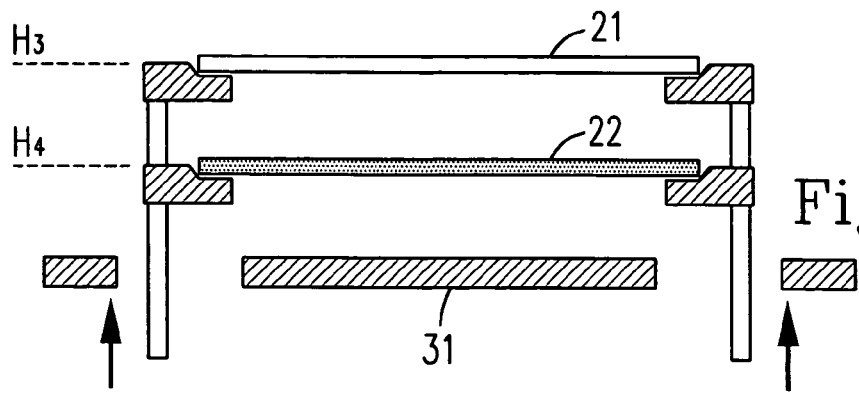

As shown in FIG. 5(E), after the transmission apparatus 30 being unloaded through adjusting the first distance between the supporter 33 to that of the transmission apparatus 30, the second distance between the supporter 33 and the carrying platform 31 is adjusted again and the supporter 33 lifts accordingly, so that the first object 21 and the second object 22 are held on a third position H3 and a fourth position H4 by the first holder 331 and second holder 332, respectively. It is worthy to be mentioned that the supporter 33 is not necessary to be moved to load out the processed objects, i.e. the first object 21 and the second object 22 are able to be located on the original positions in the processing apparatus, if the operation space inside the processing apparatus is large enough.

Figure 5F:
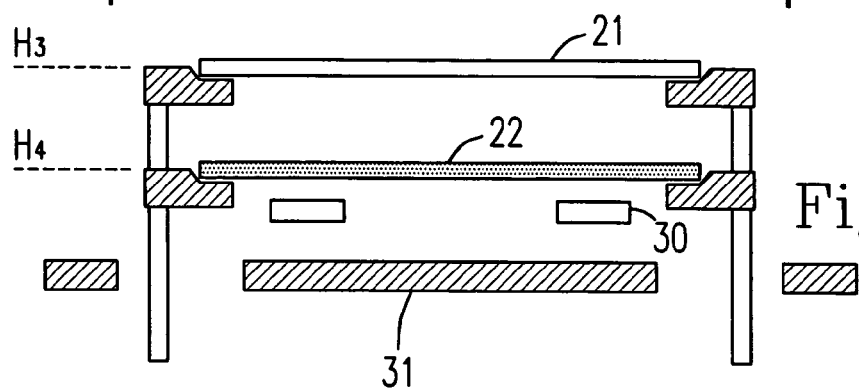

As shown in FIG. 5(F), the first distance between the supporter 33 and the transmission apparatus 30 is adjusted so that the transmission apparatus 30 is at a position between the carrying platform 31 and the second holder 332 for conveying the second object 22. In the meanwhile, the second holder 332 and the fourth position H4 are at a height higher than that of the transmission apparatus 30.

Figure 5G:
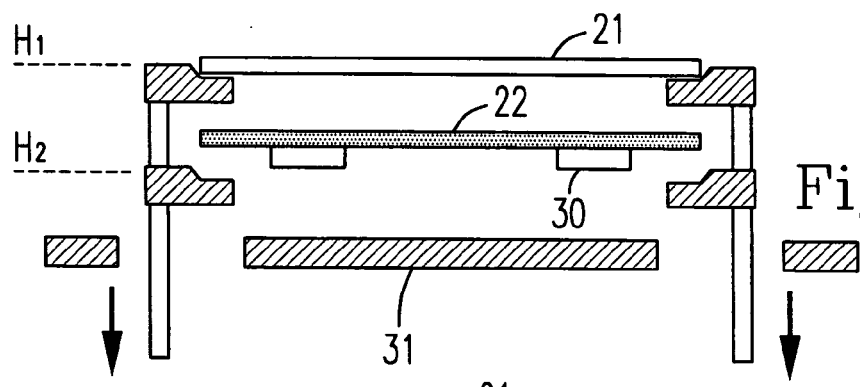

As shown in FIG. 5(G), the second distance between the supporter 33 and the carrying platform 31 is adjusted and the supporter 33 is lowered accordingly, so that the first holder 331 and the second holder 332 are respectively located on the first position H1 and the second position H2. The second object 22 held by the second holder 332 is hence disposed on the transmission apparatus 30. Alternatively, the second object 22 is unloaded from the forth position H4 if the transmission apparatus 30 is moved without moving the first holder 331 and the second holder 332.

Figure 5H:
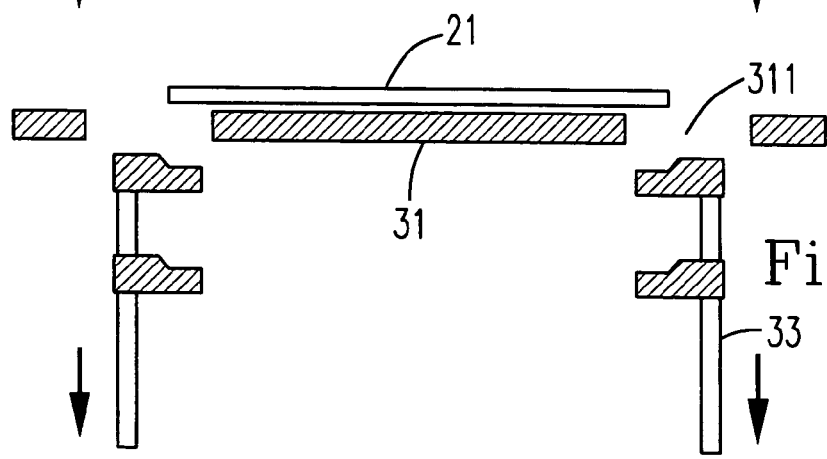

As shown in FIG. 5(H), the first distance between the supporter 33 and the transmission apparatus 30 is adjusted to move out the transmission apparatus 30 having the processed second object 22 thereon. Then the second distance between the supporter 33 and the carrying platform 31 is further adjusted and the supporter 33 is lowered accordingly, so that the first object 21 held by the first holder 331 could be disposed on the carrying platform 31. The first object 21 is being processed thereon, and the first holder 331 and the second holder 332 would keep being lowered in the meanwhile and be rotated for being recovered to the state shown in FIG. 5(A). The conveying process of the method according to the present invention may be performed again as the first object 21 is processed to form the second object 22.

In this case, the first object 21 and the first object 22 are planar electronic components such as glass substrates, circuit boards or wafers, and the processing system includes one of a sputtering system, an electroplating system, an etching system, a depositing system, a packaging system and a testing system, which are necessary to be operated in a sealed environment. In addition, the transmission apparatus 30 is a fork robot.

Figure 6C:
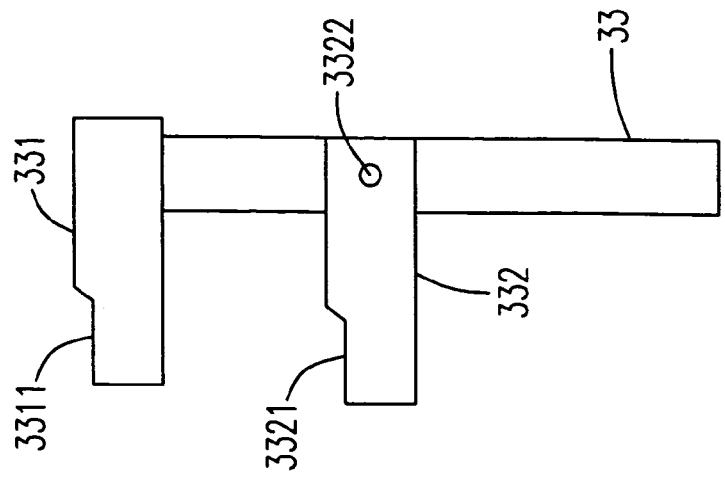
FIGS. 6(A) to 6(C) are diagrams showing the configuration of the supporter and the holders according to the preferred embodiment of the present invention.
Figure 6B:
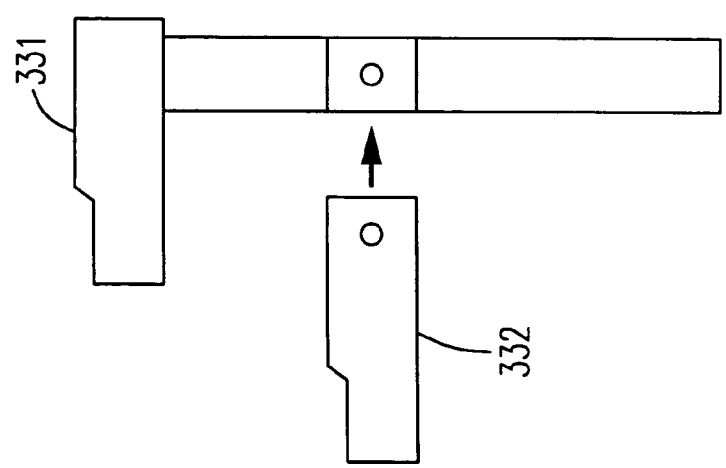
Figure 6A:
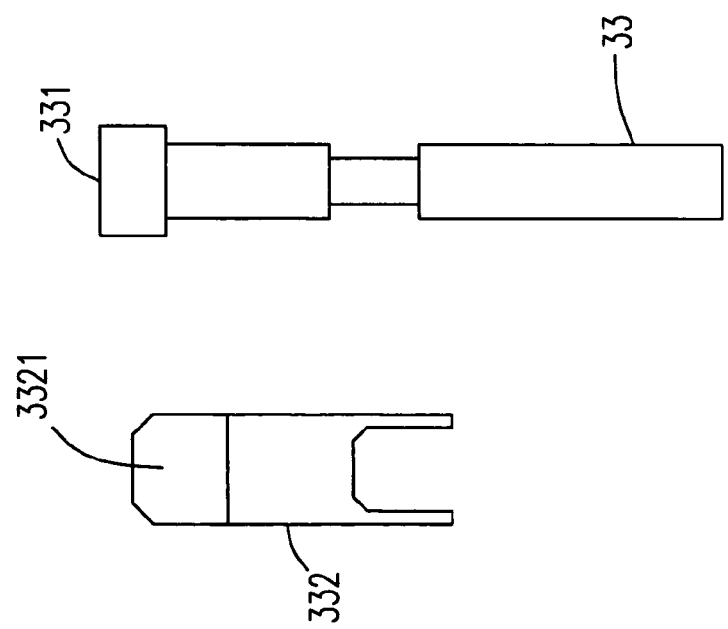

Furthermore, please refer to FIGS. 6(A) to 6(C) showing the configuration of the supporter and the holders according to the preferred embodiment of the present invention. The first holder 331 and the second holder 332 are configured on the supporter 33 by inlaying. FIG. 6(A) shows a top view of the second holder 332 having the second holding part 3322 thereon and a front view of the supporter 33 having the first holder 331 thereon. A fillister is formed at an intended position on the supporter 33 and then the second holder 332 is set thereon, as shown in FIG. 6(B). The second holder 332 is further fixed on the supporter 33 by screwing or bolting a fixing component in the fixing hole 3322, as shown in FIG.

6(C). On the other hand, the first holder 331 is also configured on the supporter 33 in this way, which is needless to be mentioned with repetition.

The glass substrate, for example, is easy to be broken in the conventional conveying apparatus and thus the processing system would shut down therefor. It generally takes at least 12 hours to clean and repair the processing system with the conveying apparatus, which results in a time consumption in the whole process. However, such a drawback of the conventional system is overcome through the method and the conveying apparatus of the present invention. Since two different kinds of supporters respectively for loading and unloading the electronic components are needless in the present invention, so that the substrate damage resulted from slipping is prevented. The stability for carrying or holding the substrate is improved and thus the substrate damage is reduced thereby. Furthermore, the configuration of the conveying apparatus and the method in the present invention are also more simplified and easily controlled. The yield of the processing system and the cost down for the production are also enhanced as a result.

Based on the above, the present invention actually provides an improved method and conveying apparatus for conveying the object in a processing system. Instead of the conventional scheme for conveying the object in the prior art, the present invention adopts a single supporter therefor. By providing two holders at positions with different heights on the supporter, and controlling the elevating movement of the holders and the supporter, the object standby for being processed and the processed one are able to be loaded in and unloaded from the processing system with greater safety and stability. The object damage resulted from slipping can be prevented efficiently. Hence, the present invention not only has novelty and progressiveness, but also has an industry utility.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for conveying an object, comprising:
   loading a first object at a first position by a transmission apparatus;
   loading a second object onto a carrying platform;
   providing a plurality of supporters, each thereof having a first holder and a second holder mounted thereon:
   rotating the supporter such that the first holder and the second holder are rotated simultaneously, wherein a first distance between the first holder and the transmission apparatus is adjusted, the first object is held at the first position by the first holder and the second object is held at a second position by the second holder;
   unloading the second object by the transmission apparatus; and
   adjusting a second distance between the first holder and the carrying platform for locating the first object on the carrying platform.

2. The method according to claim 1, wherein a distance between the first holder and the second holder is constant.

3. The method according to claim 1, wherein a holding area of the first holder for holding the first object is equal to that of the second holder for holding the second object.

4. The method according to claim 1, wherein the second holder is located at a position corresponding to that of the carrying platform when the first object is located at the first position.

5. The method according to claim 1, further comprising a step of:
   adjusting the first distance to locate the transmission apparatus between the first position and the second position after the first object is held at the first position and the second object is held at the second position.

6. The method according to claim 5, further comprising a step of:
   adjusting the second distance so that the first holder is located at a third position and the second holder is located at a fourth position.

7. The method according to claim 6, wherein the third position is equal to the first position.

8. The method according to claim 6, wherein the fourth position is equal to the second position.

9. The method according to claim 6, further comprising a step of:
   adjusting the first distance after the first holder is located at the third position and the second holder is located at the fourth position, wherein the transmission apparatus is located between the fourth position and a position of the carrying platform.

10. The method of claim 9, further comprising a step of:
    adjusting the second distance after the first distance is adjusted, so that the first holder is located at the first position and the second holder is located at the second position.

11. The method according to claim 1, further comprising a step of:
    rotating the plurality of supporters after the first object is loaded onto the carrying platform.

12. The method according to claim 11, further comprising a step of;
    adjusting the second distance after the plurality of supporters is rotated, so that the second holder is moved to be located at a position of the carrying platform.

13. The method according to claim 12, further comprising a step of:
    rotating the plurality of supporters after the second holder is moved to be located at the position of the carrying platform.

14. The method according to claim 1, wherein the plurality of supporters are four supporters.

15. The method according to claim 1, wherein the plurality of supporters are disposed on a elevating platform.

16. The method according to claim 1, wherein the plurality of supporters are linked to one another through a plurality of rods.

* * * * *